(12) United States Patent
Zhang

(10) Patent No.: US 10,446,417 B2
(45) Date of Patent: Oct. 15, 2019

(54) HOT VACUUM DRYING DEVICE APPLIED FOR FLEXIBLE SUBSTRATE

(71) Applicant: Wuhan China Star Optoelectronics Technology Co., Ltd., Wuhan (CN)

(72) Inventor: Chun Zhang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 353 days.

(21) Appl. No.: 15/506,238

(22) PCT Filed: Dec. 29, 2016

(86) PCT No.: PCT/CN2016/113030
§ 371 (c)(1),
(2) Date: Feb. 24, 2017

(87) PCT Pub. No.: WO2018/113015
PCT Pub. Date: Jun. 28, 2018

(65) Prior Publication Data
US 2018/0218923 A1    Aug. 2, 2018

(51) Int. Cl.
*H01L 21/67*    (2006.01)
*H01L 51/56*    (2006.01)
(Continued)

(52) U.S. Cl.
CPC ...... *H01L 21/67034* (2013.01); *B05D 3/0254* (2013.01); *H01L 21/67109* (2013.01);
(Continued)

(58) Field of Classification Search
CPC ......... H01L 21/67034; H01L 21/68742; H01L 21/67109; H01L 51/56
See application file for complete search history.

(56) References Cited

U.S. PATENT DOCUMENTS 5,933,943 A * 8/1999 Chou ................ H01L 21/68742
                                                140/147
6,435,798 B1 * 8/2002 Satoh .................. C23C 16/4586
                                                118/728
(Continued)

FOREIGN PATENT DOCUMENTS

| CN | 203578136 U | 5/2014 |
| CN | 105080803 A | 11/2015 |
| CN | 205780150 U | 12/2016 |

*Primary Examiner* — David J Laux
(74) *Attorney, Agent, or Firm* — Leong C. Lei

(57) ABSTRACT

The present invention provides a hot vacuum drying device applied for a flexible substrate. By respectively improving the first support pin (5) and the second support pin (6) of the hot vacuum drying device to be an insertion structure or a layer jacket structure, which can accelerate heat conduction to make a temperature difference between a contact part of the substrate (7) with the first support pin (5) or the second support pin (6) and a non-contact part of the substrate (7) with the first support pin (5) or the second support pin (6) decrease and to make heating uniform, and thus to reduce pin muras caused by the support pins, and to allow an appropriate increase in the amount of the support pins in a middle zone for reducing the film unevenness due to sagging of the substrate.

11 Claims, 7 Drawing Sheets

(51) Int. Cl.
  *B05D 3/02* (2006.01)
  *H01L 21/687* (2006.01)
  *H01L 51/00* (2006.01)

(52) U.S. Cl.
  CPC .... *H01L 21/68742* (2013.01); *H01L 51/0026* (2013.01); *H01L 51/56* (2013.01); *H01L 51/0097* (2013.01); *H01L 2251/5338* (2013.01)

(56) References Cited

U.S. PATENT DOCUMENTS

| | | | | |
|---|---|---|---|---|
| 6,884,319 B2* | 4/2005 | Kim | ............... | C23C 16/4581 118/725 |
| 7,081,165 B2* | 7/2006 | Paik | ............... | C23C 16/4581 118/723 E |
| 7,750,818 B2* | 7/2010 | Lee | ............... | H01L 21/67259 340/686.1 |
| 7,867,926 B2* | 1/2011 | Satoh | ............... | H01L 21/3105 117/204 |
| 7,871,470 B2* | 1/2011 | Schieve | ............ | C23C 16/4582 118/728 |
| 7,964,038 B2* | 6/2011 | Patalay | ............ | H01L 21/68785 118/728 |
| 7,988,817 B2* | 8/2011 | Son | ............... | H01L 21/68742 118/728 |
| 8,211,230 B2* | 7/2012 | Verghese | ........... | C23C 16/4408 118/715 |
| 8,256,754 B2* | 9/2012 | Lerner | ............ | H01L 21/68742 269/54 |
| 8,603,249 B2* | 12/2013 | Kim | ............... | G02F 1/1303 118/715 |
| 8,635,784 B2* | 1/2014 | Ettinger | ........... | H01L 21/67034 271/267 |
| 8,828,257 B2* | 9/2014 | Kitada | ............ | H01J 37/32082 156/345.51 |
| 9,027,504 B2* | 5/2015 | Miyamoto | ....... | H01L 21/67109 118/58 |
| 9,414,439 B2* | 8/2016 | Wang | .............. | H05B 1/0288 |
| 10,195,704 B2* | 2/2019 | Himmelsbach | ....... | B23Q 7/005 |
| 2003/0075387 A1* | 4/2003 | Wang | .............. | C23C 14/50 187/250 |
| 2011/0033620 A1* | 2/2011 | Polyak | ........... | C23C 16/4586 427/248.1 |
| 2011/0114014 A1* | 5/2011 | Sakurai | ........... | C23C 16/24 117/88 |
| 2014/0216332 A1* | 8/2014 | Omori | ............ | H01L 21/68742 118/50 |
| 2017/0051977 A1* | 2/2017 | Zhao | .............. | F26B 25/004 |
| 2018/0082866 A1* | 3/2018 | Alayavalli | ....... | H01L 21/67103 |

\* cited by examiner

HOT VACUUM DRYING DEVICE APPLIED FOR FLEXIBLE SUBSTRATE

FIELD OF THE INVENTION

The present invention relates to a display technology field, and more particularly to a hot vacuum drying device applied for a flexible substrate.

BACKGROUND OF THE INVENTION

The Organic Light Emitting Diode (OLED) display possesses many outstanding properties of self-illumination, low driving voltage, high luminescence efficiency, short response time, high clarity and contrast, near 180° view angle, wide range of working temperature, applicability of flexible display and large scale full color display. The OLED is considered to have the most potential.

The flexible display is the direction of the future OLED development. The manufacture of the flexible substrate is the pre-process of manufacturing the flexible OLED, and directly relates to and influences the quality of the entire manufacture process of the flexible OLED in the following. In the manufacture of the flexible substrate, the organic coating material mainly used is Polyimide Amic Acid (PAA) (generally known as PI Solution in the industry, which is referred to as PI), Polyethylene Terephthalate (PET) and PEN Polyethylene Naphthalate (PEN), and PI is more widely used. The basic manufacture flow of the flexible substrate sequentially comprises: substrate cleaning, organic materials coating, hot vacuum drying (HVCD process), baking, optical detecting and repairing. The hot vacuum drying process mainly is to use the hot vacuum drying device for evacuation for reducing the pressure of the seal chamber to help the heating, to raise the evaporation rate of the solvent contained in the organic material liquid such as PI, and to remove the solvent component of the organic material liquid such as PI for achieving the results of pre-curing the organic materials and shortening the follow-up baking process time.

As shown in FIG. 1 and FIG. 2, the hot vacuum drying device applied for the flexible substrate of the present invention comprises a seal chamber 1', a lower heating plate 2' fixed at a lower part of the seal chamber 1', an upper heating plate 3' fixed at an upper part of the seal chamber 1', a lifter 4' located under the seal chamber 1', a plurality of support pins 5' being fixed at the lifter 4' and penetrating through a bottom plate of the seal chamber 1' and the lower heating plate 2', and being driven by the lifter 4' to lift and a plurality of second support pins 6' fixed on the lower heating plate 2'.

In the hot vacuum drying process, the first support pins 5' or the second support pins 6' are employed to support a substrate 7' coated with organic material liquid to be positioned between the lower heating plate 2' and the upper heating plate 3' for baking, and the first support pins 5' can control the distance of the substrate 7' and the lower heating plate 2', and the distance of the upper end of the second support pins 6' and the lower heating plate 2' is about 0.3 mm and cannot be adjusted. As shown in FIG. 3 and FIG. 4, both the first support pins 5' and the second support pins 6' are integral solid cylindrical pins.

Because the contact parts of the substrate 7' with the first support pins 5' and the second support pins 6' are acted with the physical block function of the corresponding support pins, the heating degree of the lower heating plate 2' to the contact parts of the bottom of the substrate 7' and the support pins, and the heating degree to the non-contact parts of the bottom and the support pins are not consistent to cause the temperature difference and to lead to the inconsistency of the organic material pre-curing degrees of the two regions, the uneven thickness to result in the uneven color and to cause the Pin Mura. Besides, for preventing the increase of the amount of the pin muras caused by the large amount of the support pins, the general hot vacuum drying device reduces the amount of the support pins, and more particularly reduce the amount of the support pins of the middle zone, and thus to exacerbate the load-bearing of the peripheral support pins against the substrate 7', and therefore, to enlarge the sagging of the substrate 7' coated with the organic material liquid, and the organic material liquid flows to the sagging center of the substrate 7' due to the gravity to lead to the more uneven film thickness and to exacerbate the serious pin muras.

SUMMARY OF THE INVENTION

An objective of the present invention is to provide a hot vacuum drying device applied for a flexible substrate, which can make the heating of the contact part of the bottom surface of the substrate coated with the organic material liquid and the support pin, and the non-contact portion of the bottom surface of the substrate and the support pin be heated more uniformly, to reduce the pin muras for reducing the film unevenness.

For realizing the aforesaid objective, the present invention provides a hot vacuum drying device applied for a flexible substrate, comprising a seal chamber, a lower heating plate fixed at a lower part of the seal chamber, an upper heating plate fixed at an upper part of the seal chamber, a lifter located under the seal chamber, a plurality of support pins fixed at the lifter and driven by the lifter to lift and a plurality of second support pins fixed on the lower heating plate;

the first support pin or the second support pin supporting a substrate coated with organic material liquid to be positioned between the lower heating plate and the upper heating plate for baking; both the first support pin and the second support pin respectively using an insertion structure or a layer jacket structure to accelerate heat conduction to make a temperature difference between a contact part of the substrate with the first support pin or the second support pin and a non-contact part of the substrate with the first support pin or the second support pin decrease.

The first support pin uses an insertion structure, and comprises a base part, a transition part and a top part;

the base part comprises a long cylinder and a small cylinder protruding from and coaxial with an upper end of the long cylinder; a diameter of the smaller cylinder is smaller than a diameter of the long cylinder; the transition part is nested outside the small cylinder and at the upper end of the long cylinder, and the top part is nested on the transition part; the base part, the transition part and the top part uses different materials to make a heat conductivity of the top part higher than a heat conductivity of the transition part, and the heat conductivity of the transition part is higher than a heat conductivity of the base part.

A material of the base part is aluminum or an aluminum alloy, and a material of the transition part is ceramic, and a material of the top part is a silver alloy.

An upper end of the top part appears to be hemispherical.

The diameter of the long cylinder of the base part is 3 mm-10 mm; the diameter of the small cylinder is ⅕ of the diameter of the long cylinder, and a height is 2 mm-5 mm; a diameter of the transition part is equal to the diameter of the long cylinder, and a thickness is 0.5 mm-1 mm; a diameter of the top part is equal to the diameter of the long cylinder.

The first support pin uses the layer jacket structure, and comprises a first outer sleeve which has a close upper end, and is hollow and cylindrical, a first inner heating element located in the first outer sleeve and a first wire electrically connected to the first inner heating element;

a wall of the first outer sleeve is formed with a through hole for passing the first wire; the first outer sleeve uses an insulation material, and the first inner heating element uses the same material of the lower heating plate; the other end of the first wire is electrically connected to a power source supplying electrical power for the lower heating plate.

The second support pin uses the layer jacket structure, and comprises a second outer sleeve which has a close upper end, and is hollow and cylindrical, a second inner heating element located in the second outer sleeve and a second wire electrically connected to the second inner heating element;

the second outer sleeve uses an insulation material, and the second inner heating element uses the same material of the lower heating plate; the other end of the second wire is electrically connected to the lower heating plate.

Upper ends of the first outer sleeve and the second outer sleeve appear to be hemispherical, and upper ends of the first inner heating element and the second inner heating element appear to be hemispherical.

An outer diameter of the first outer sleeve is 3 mm-10 mm; a diameter of the first inner heating element is ⅗-¾ of an outer diameter of the first outer sleeve.

An outer diameter of the second outer sleeve is 2 mm-5 mm, and a lower end thereof is embedded in the lower heating plate by 2 mm-3 mm; a diameter of the second inner heating element is ⅗-¾ of an outer diameter of the second outer sleeve.

The present invention further provides a hot vacuum drying device applied for a flexible substrate, comprising a seal chamber, a lower heating plate fixed at a lower part of the seal chamber, an upper heating plate fixed at an upper part of the seal chamber, a lifter located under the seal chamber, a plurality of support pins fixed at the lifter and driven by the lifter to lift and a plurality of second support pins fixed on the lower heating plate;

the first support pin or the second support pin employed to support a substrate coated with organic material liquid to be positioned between the lower heating plate and the upper heating plate for baking; both the first support pin and the second support pin respectively using an insertion structure or a layer jacket structure to accelerate heat conduction to make a temperature difference between a contact part of the substrate with the first support pin or the second support pin and a non-contact part of the substrate with the first support pin or the second support pin decrease;

wherein the first support pin uses the layer jacket structure, and comprises a first outer sleeve which has a close upper end, and is hollow and cylindrical, a first inner heating element located in the first outer sleeve and a first wire electrically connected to the first inner heating element;

a wall of the first outer sleeve is formed with a through hole for passing the first wire; the first outer sleeve uses an insulation material, and the first inner heating element uses the same material of the lower heating plate; the other end of the first wire is electrically connected to a power source supplying electrical power for the lower heating plate;

wherein the second support pin uses the layer jacket structure, and comprises a second outer sleeve which has a close upper end, and is hollow and cylindrical, a second inner heating element located in the second outer sleeve and a second wire electrically connected to the second inner heating element;

the second outer sleeve uses an insulation material, and the second inner heating element uses the same material of the lower heating plate; the other end of the second wire is electrically connected to the lower heating plate;

wherein upper ends of the first outer sleeve and the second outer sleeve appear to be hemispherical, and upper ends of the first inner heating element and the second inner heating element appear to be hemispherical;

wherein an outer diameter of the first outer sleeve is 3 mm-10 mm; a diameter of the first inner heating element is ⅗-¾ of an outer diameter of the first outer sleeve;

wherein an outer diameter of the second outer sleeve is 2 mm-5 mm, and a lower end thereof is embedded in the lower heating plate by 2 mm-3 mm; a diameter of the second inner heating element is ⅗-¾ of an outer diameter of the second outer sleeve.

The benefits of the present invention are: the present invention provides a hot vacuum drying device applied for a flexible substrate. By respectively improving the first support pin and the second support pin of the hot vacuum drying device to be an insertion structure or a layer jacket structure, which can accelerate heat conduction to make a temperature difference between a contact part of the substrate with the first support pin or the second support pin and a non-contact part of the substrate with the first support pin or the second support pin decrease and to make heating uniform, and thus to reduce pin muras caused by the support pins, and to allow an appropriate increase in the amount of the support pins in a middle zone for reducing the film unevenness due to sagging of the substrate.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
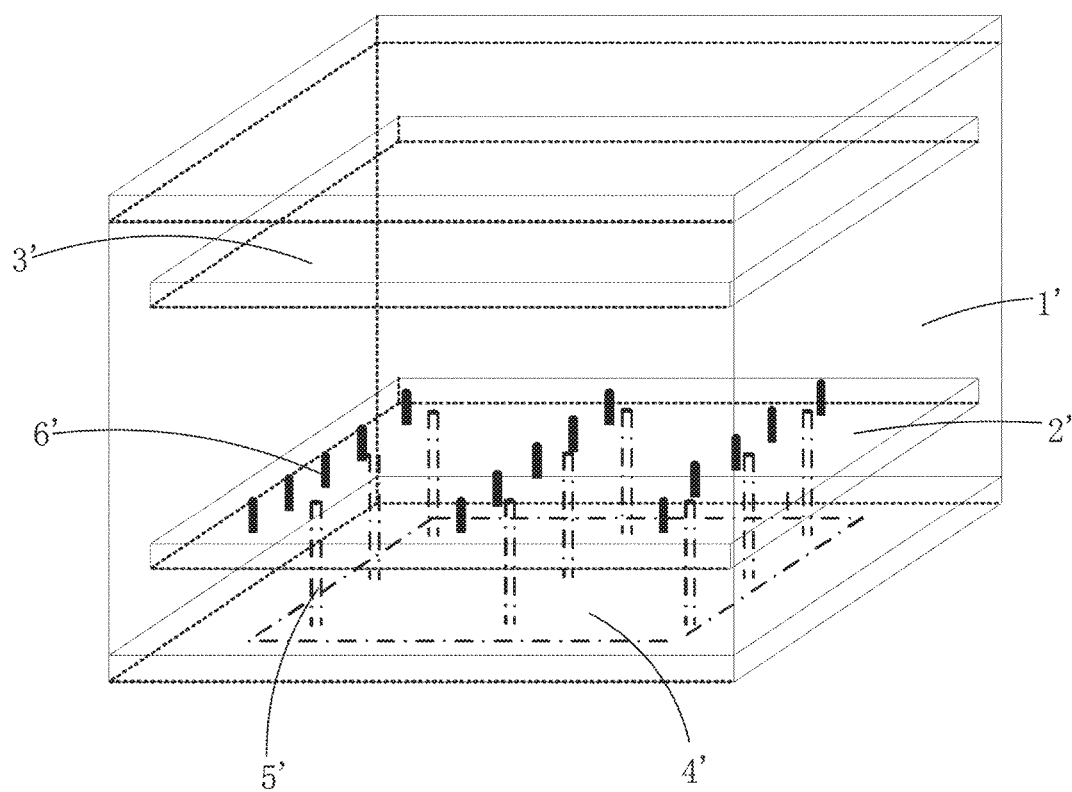
FIG. 1 is a three-dimensional structure schematic diagram of a hot vacuum drying device applied for a flexible substrate according to prior art.
Figure 2:
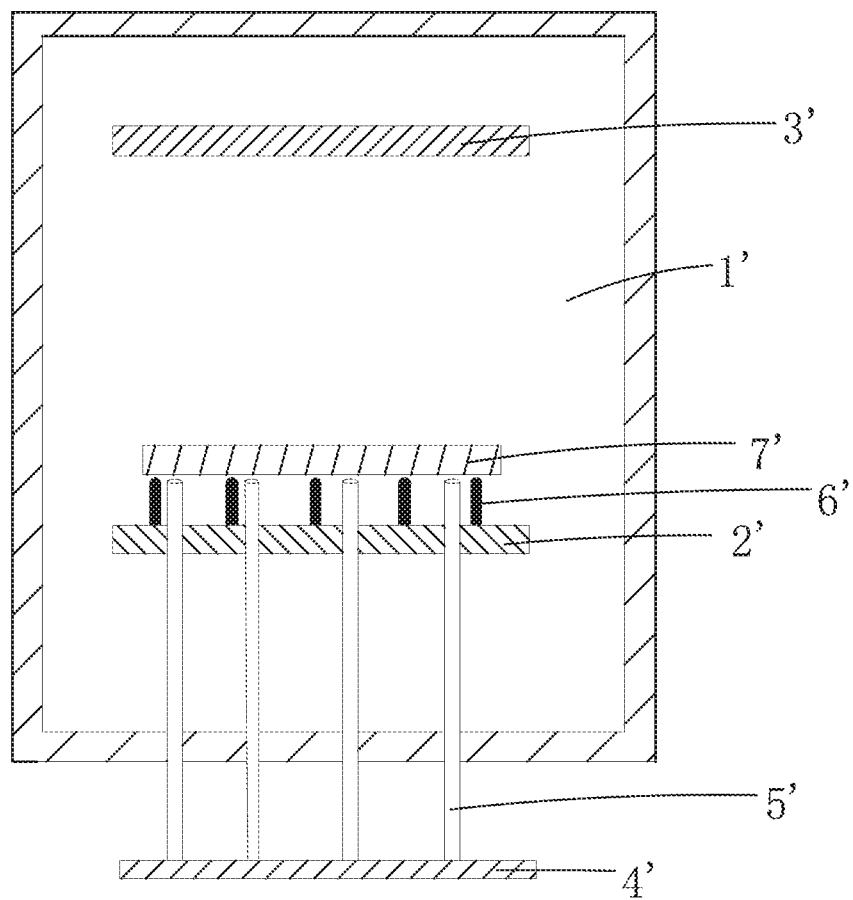
FIG. 2 is a sectional structure schematic diagram of a hot vacuum drying device applied for a flexible substrate according to prior art.
Figure 3:
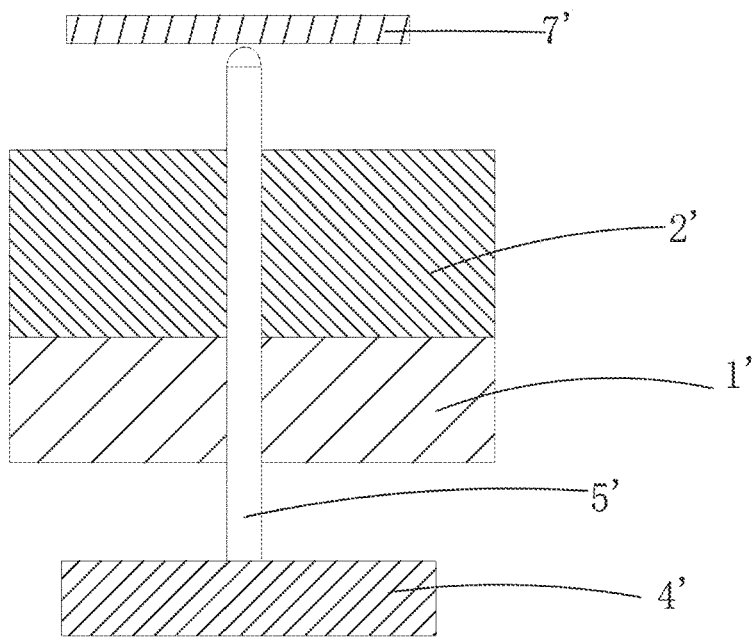
FIG. 3 is a sectional diagram of a first support pin in a hot vacuum drying device applied for a flexible substrate according to prior art.
Figure 4:
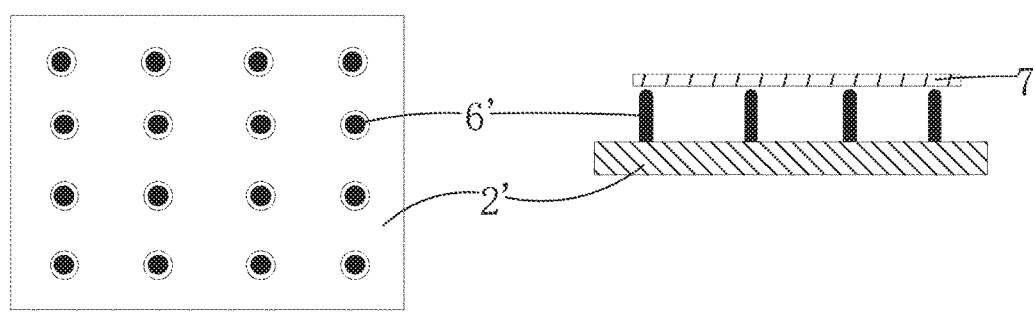
FIG. 4 are a top view diagram and a sectional diagram of a second support pin in a hot vacuum drying device applied for a flexible substrate according to prior art.
Figure 5:
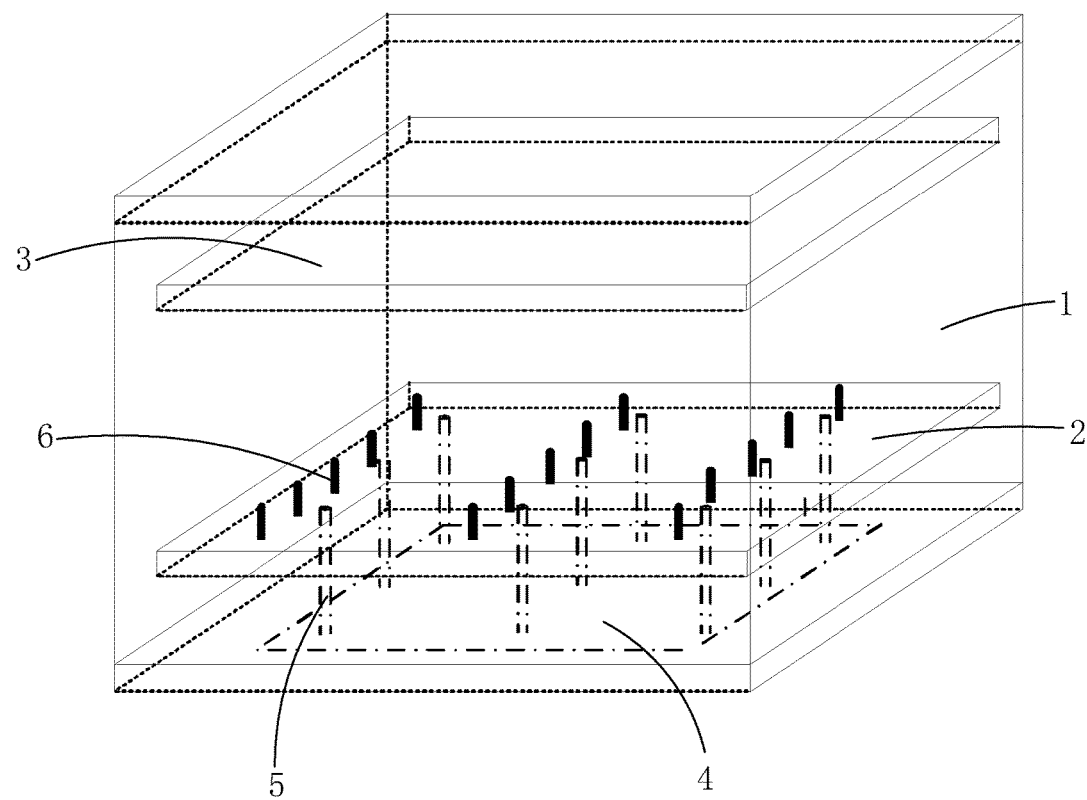
FIG. 5 is a three-dimensional structure schematic diagram of a hot vacuum drying device applied for a flexible substrate according to the present invention.
Figure 6:
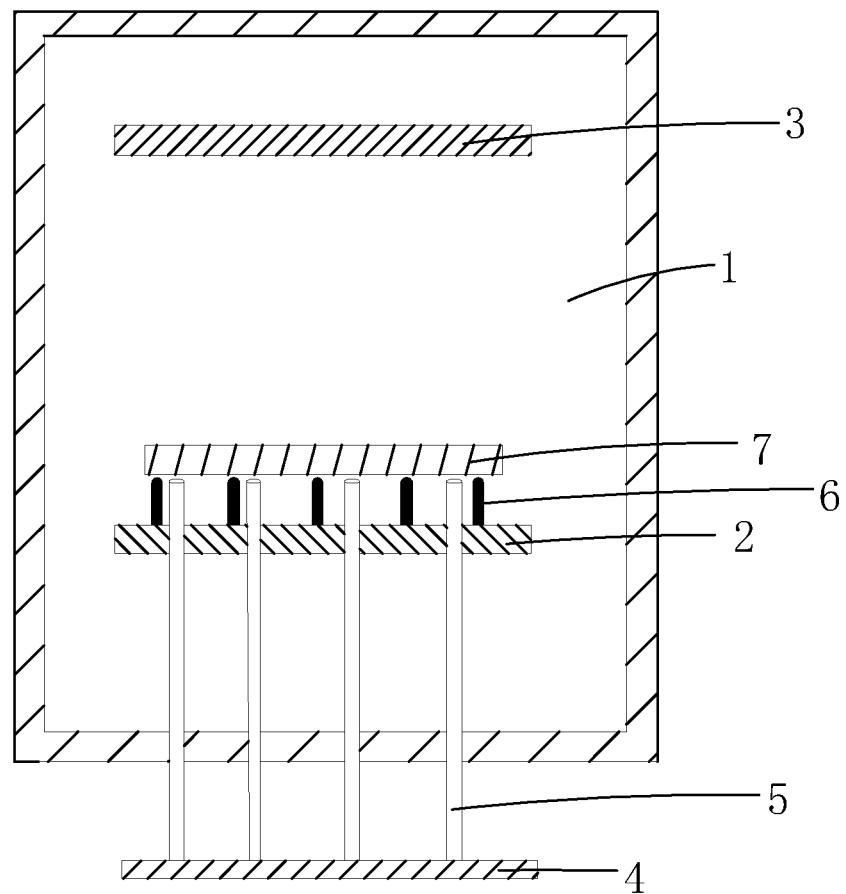
FIG. 6 is a sectional structure schematic diagram of a hot vacuum drying device applied for a flexible substrate according to the present invention.

Please refer from FIG. 5 to FIG. 9 together. The present invention provides a hot vacuum drying device applied for a flexible substrate. As shown in FIG. 5 and FIG. 6, the hot vacuum drying device applied for the flexible substrate of the present invention comprises a seal chamber 1, a lower heating plate 2 fixed at a lower part of the seal chamber 1, an upper heating plate 3 fixed at an upper part of the seal chamber 1, a lifter 4 located under the seal chamber 1, a plurality of support pins 5 being fixed at the lifter 4 and penetrating through a bottom plate of the seal chamber 1 and the lower heating plate 2, and being driven by the lifter 4 to lift and a plurality of second support pins 6 fixed on the lower heating plate 2.

In the hot vacuum drying process, the first support pin 5 or the second support pin 6 supports a substrate 7 coated with organic material liquid to be positioned between the lower heating plate 2 and the upper heating plate 3 for baking. Specifically, the first support pin 5 can control the distance of the substrate 7 and the lower heating plate 2, and the distance of the upper end of the second support pin 6 and the lower heating plate 2 is fixed and cannot be adjusted; as the lifter 4 drives the plurality of first support pins 5 ascending to be higher than the upper ends of the second support pins 6, the first support pins 5 supports the substrate 7 coated with organic material liquid, and as the lifter 4 drives the plurality of first support pins 5 descending to be lower than the upper ends of the second support pins 6, the second support pins 6 supports the substrate 7 coated with organic material liquid.

The present invention focuses on the structural improvement of the first support pin 5 and the second support pin 6 in the hot vacuum drying device: both the first support pin 5 and the second support pin 6 respectively use an insertion structure or a layer jacket structure.

Figure 7:
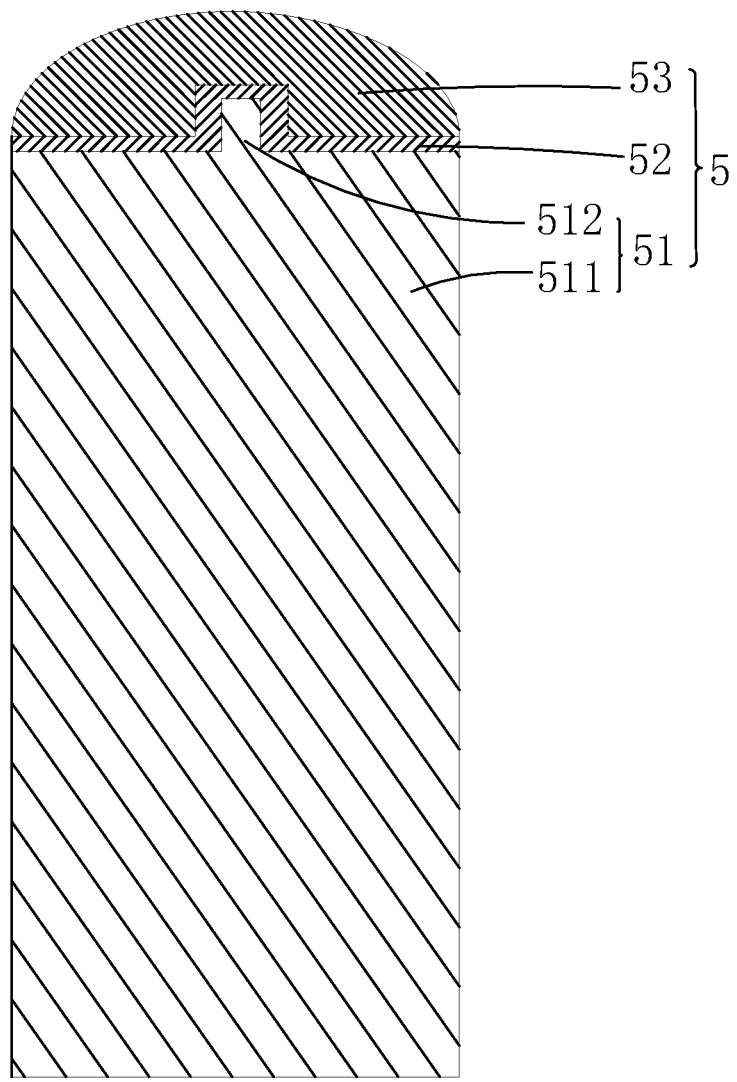
FIG. 7 is a sectional diagram of the first structure formation of a first support pin in a hot vacuum drying device applied for a flexible substrate according to the present invention.

As shown in FIG. 7, the first support pin 5 uses an insertion structure, and comprises a base part 51, a transition part 52 and a top part 53. The base part 51 comprises a long cylinder 511 and a small cylinder 512 protruding from and coaxial with an upper end of the long cylinder 511; a diameter of the smaller cylinder 512 is smaller than a diameter of the long cylinder 511; the transition part 52 is nested outside the small cylinder 512 and at the upper end of the long cylinder 511, and the top part 53 is nested on the transition part 52.

Specifically, the diameter of the long cylinder 511 of the base part 51 is 3 mm-10 mm, and the lower end of the base part 51 is fixed at the lifter 4; the diameter of the small cylinder 512 is ⅕ of the diameter of the long cylinder 511, and a height is 2 mm-5 mm; a diameter of the transition part 52 is equal to the diameter of the long cylinder 511, and a thickness is 0.5 mm-1 mm; a diameter of the top part 53 is equal to the diameter of the long cylinder 511, and an upper end of the top part 53 appears to be hemispherical to reduce the contact area with the substrate 7.

Furthermore, the respective parts of the first support pin 5 uses different materials to make the heat conductivities of the respective parts different:

The base 51 uses metal with the high heat conductivity and the resistance to the corrosion of the organic solvents (such as methyl pyrrolidone (NMP)), and aluminum or an aluminum alloy which is casting made is preferred. The base part 51 mainly serves as supporting, fixing the transition part 52 and the top part 53, and for heat conduction.

The transition part 52 uses an insulation material, of which the heat conductivity is higher than that of the base part 51, and the insulation is strong, and the thermodynamic expansion coefficient is close to those of metal aluminum and silver, and the ceramic is preferred. The transition part 52 serves for heat conduction, heat insulation and electrostatics proof.

The top part 53 uses the metal of which the heat conductivity is higher than that of transition part 52, and the silver alloy is preferred. The top part 53 serves for heat conduction and contact and support of the substrate 7. Because the base part 51, the transition part 52 and the top part 53 of the first support pin 5 uses different materials to make a heat conductivity of the top part 53 higher than a heat conductivity of the transition part 52, and the heat conductivity of the transition part 52 is higher than a heat conductivity of the base part 51. As the support pins 5 using the insertion structure are used to support the substrate 7 for baking, the heat conduction rate is raised to make a temperature difference between a contact part of the substrate 7 with the first support pins 5 and a non-contact part of the substrate 7 with the first support pins 5 decrease, which is beneficial to make the heating of the substrate 7 uniform, and thus to reduce pin muras caused by the first support pins 5, and meanwhile, to allow an appropriate increase in the amount of the first support pins 5 in a middle zone for reducing the film unevenness due to sagging of the substrate 7.

Figure 8:
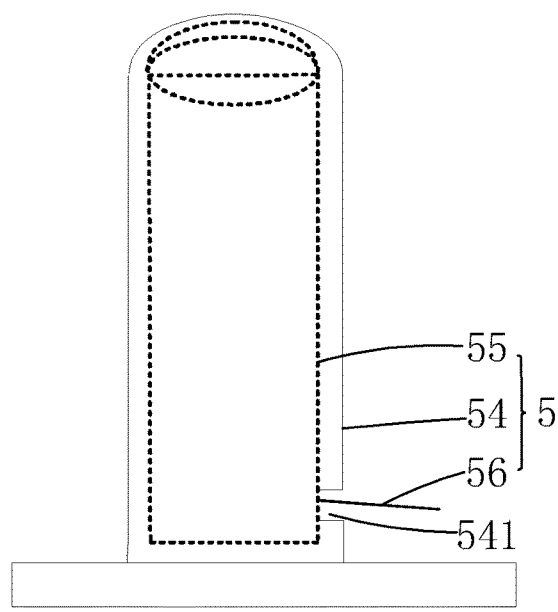
FIG. 8 is a schematic diagram of the second structure formation of a first support pin in a hot vacuum drying device applied for a flexible substrate according to the present invention.

As shown in FIG. 8, the first support pin 5 also can use a sleeve jacket structure.

The first support pin 5 comprises a first outer sleeve 54 which has a close upper end, and is hollow and cylindrical, a first inner heating element 55 located in the first outer sleeve 54 and solid, and a first wire 56 of which one end is electrically connected to the first inner heating element 55 and the other end is electrically connected to a power source supplying electrical power for the lower heating plate 2.

Specifically:

a wall of the first outer sleeve 54 is formed with a through hole 541 for passing the first wire 56.

The respective parts of the first support pin 5 uses different materials to make the heat conductivities of the respective parts different: the first outer sleeve 54 uses the material of which the insulativity is good and the heat conductivity is strong, and the quartz is preferred; the first inner heating element 55 uses the same material of the lower heating plate 2.

An outer diameter of the first outer sleeve 54 is 3 mm-10 mm; a diameter of the first inner heating element 55 is ⅗-¾ of an outer diameter of the first outer sleeve 54.

The upper end of the first outer sleeve 54 appears to be hemispherical to reduce the contact area with the substrate 7; the upper end of the first heating element 55 also appears to be hemispherical as well as the upper end of the first outer sleeve 54.

As the substrate 7 coated with organic material liquid is positioned in the hot vacuum drying device, and the first support pins 5 are in charge of supporting, because the first inner heating elements 55 of the first support pins 5 and the lower heating plate 2 share the same power source, and the temperature controls are consistent, and the heat is rapidly conducted to the upper ends of the first outer sleeves 54 via the first inner heating elements 55 and the first outer sleeves 54, and the upper ends of the first outer sleeves 54 are rapidly heated, and the heat is conducted to the contact parts with the substrate 7, which can significantly reduce or even eliminate the temperature difference between contact parts of the substrate 7 with the first support pins 5 and non-contact parts of the substrate 7 with the first support pins 5, which is beneficial to make the heating of the substrate 7 uniform, and thus to reduce or even eliminate the pin muras caused by the first support pins 5, and meanwhile, to allow an appropriate increase in the amount of the first support pins 5 in a middle zone for reducing the film unevenness due to sagging of the substrate 7.

Figure 9:
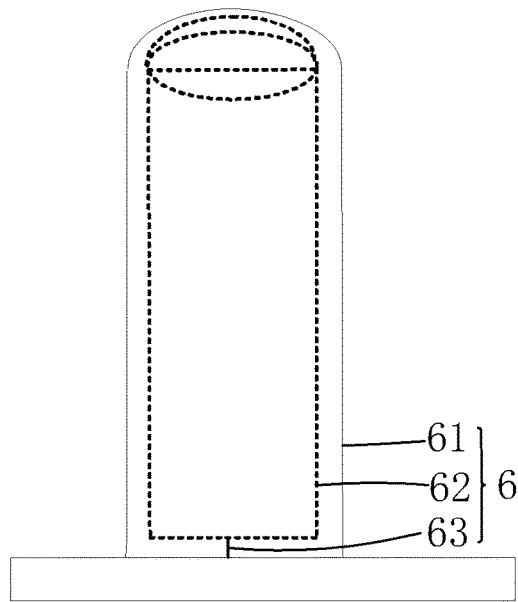
FIG. 9 is a schematic diagram of a second support pin in a hot vacuum drying device applied for a flexible substrate according to the present invention.

As shown in FIG. 9, the second support pin 6 uses the layer jacket structure, and comprises a second outer sleeve 61 which has a close upper end, and is hollow and cylindrical, a second inner heating element 62 located in the second outer sleeve 61 and solid, and a second wire 2 of which one end is electrically connected to the second inner heating element 2 and other end is electrically connected to the lower heating plate 2.

Specifically, the respective parts of the second support pin 6 uses different materials to make the heat conductivities of the respective parts different: the second outer sleeve 61 uses the material of which the insulativity is good, and the heat conductivity is strong, and the quartz is preferred; the second inner heating element 62 uses the same material of the lower heating plate 2.

An outer diameter of the second outer sleeve 61 is 2 mm-5 mm, and a lower end thereof is embedded in the lower heating plate 2 by 2 mm-3 mm; a diameter of the second inner heating element 62 is ⅗-¾ of an outer diameter of the second outer sleeve 61.

The upper end of the second outer sleeve 61 appears to be hemispherical to reduce the contact area with the substrate 7; the upper end of the second heating element 62 also appears to be hemispherical as well as the upper end of the second outer sleeve 61.

As the substrate 7 coated with organic material liquid is positioned in the hot vacuum drying device, and the second support pins 6 are in charge of supporting, because the second inner heating elements 62 of the second support pins 6 and the lower heating plate 2 share the same power source, and the temperature controls are consistent, and the heat is rapidly conducted to the upper ends of the second outer sleeves 61 via the second inner heating elements 62 and the second outer sleeves 61, and the upper ends of the second outer sleeves 61 are rapidly heated, and the heat is conducted to the contact parts with the substrate 7, which can reduce or even eliminate the temperature difference between contact parts of the substrate 7 with the second support pins 6, and non-contact parts of the substrate 7 with the second support pins 6, which is beneficial to make the heating of the substrate 7 uniform, and thus to reduce or even eliminate the pin muras caused by the second support pins 6, and meanwhile, to allow an appropriate increase in the amount of the second support pins 6 in a middle zone for reducing the film unevenness due to sagging of the substrate 7.

In conclusion, in the hot vacuum drying device applied for the flexible substrate of the present invention, by respectively improving the first support pin and the second support pin of the hot vacuum drying device to be an insertion structure or a layer jacket structure, which can accelerate heat conduction to make a temperature difference between a contact part of the substrate with the first support pin or the second support pin and a non-contact part of the substrate with the first support pin or the second support pin decrease and to make heating uniform, and thus to reduce pin muras caused by the support pins, and to allow an appropriate increase in the amount of the support pins in a middle zone for reducing the film unevenness due to sagging of the substrate.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A hot vacuum drying device applied for a flexible substrate, comprising a seal chamber, a lower heating plate fixed at a lower part of the seal chamber, an upper heating plate fixed at an upper part of the seal chamber, a lifter located under the seal chamber, a plurality of support pins fixed at the lifter and driven by the lifter to lift and a plurality of second support pins fixed on the lower heating plate;

the first support pin or the second support pin employed to support a substrate coated with organic material liquid to be positioned between the lower heating plate and the upper heating plate for baking; both the first support pin and the second support pin respectively using an insertion structure or a layer jacket structure to accelerate heat conduction to make a temperature difference between a contact part of the substrate with the first support pin or the second support pin and a non-contact part of the substrate with the first support pin or the second support pin decrease.

2. The hot vacuum drying device applied for the flexible substrate according to claim 1, wherein the first support pin uses an insertion structure, and comprises a base part, a transition part and a top part;

the base part comprises a long cylinder and a small cylinder protruding from and coaxial with an upper end of the long cylinder; a diameter of the smaller cylinder is smaller than a diameter of the long cylinder; the transition part is nested outside the small cylinder and at the upper end of the long cylinder, and the top part is nested on the transition part; the base part, the transition part and the top part uses different materials to make a heat conductivity of the top part higher than a heat conductivity of the transition part, and the heat conductivity of the transition part is higher than a heat conductivity of the base part.

3. The hot vacuum drying device applied for the flexible substrate according to claim 2, wherein a material of the base part is aluminum or an aluminum alloy, and a material of the transition part is ceramic, and a material of the top part is a silver alloy.

4. The hot vacuum drying device applied for the flexible substrate according to claim 2, wherein an upper end of the top part appears to be hemispherical.

5. The hot vacuum drying device applied for the flexible substrate according to claim 4, wherein the diameter of the long cylinder of the base part is 3 mm-10 mm; the diameter of the small cylinder is ⅕ of the diameter of the long cylinder, and a height is 2 mm-5 mm; a diameter of the transition part is equal to the diameter of the long cylinder, and a thickness is 0.5 mm-1 mm; a diameter of the top part is equal to the diameter of the long cylinder.

6. The hot vacuum drying device applied for the flexible substrate according to claim 1, wherein the first support pin uses the layer jacket structure, and comprises a first outer sleeve which has a close upper end, and is hollow and cylindrical, a first inner heating element located in the first outer sleeve and a first wire electrically connected to the first inner heating element;

a wall of the first outer sleeve is formed with a through hole for passing the first wire; the first outer sleeve uses an insulation material, and the first inner heating element uses the same material of the lower heating plate; the other end of the first wire is electrically connected to a power source supplying electrical power for the lower heating plate.

7. The hot vacuum drying device applied for the flexible substrate according to claim 6, wherein the second support pin uses the layer jacket structure, and comprises a second outer sleeve which has a close upper end, and is hollow and cylindrical, a second inner heating element located in the second outer sleeve and a second wire electrically connected to the second inner heating element;

the second outer sleeve uses an insulation material, and the second inner heating element uses the same material of the lower heating plate; the other end of the second wire is electrically connected to the lower heating plate.

8. The hot vacuum drying device applied for the flexible substrate according to claim 7, wherein upper ends of the first outer sleeve and the second outer sleeve appear to be hemispherical, and upper ends of the first inner heating element and the second inner heating element appear to be hemispherical.

9. The hot vacuum drying device applied for the flexible substrate according to claim 8, wherein an outer diameter of the first outer sleeve is 3 mm-10 mm; a diameter of the first inner heating element is $3/5$-$3/4$ of an outer diameter of the first outer sleeve.

10. The hot vacuum drying device applied for the flexible substrate according to claim 8, wherein an outer diameter of the second outer sleeve is 2 mm-5 mm, and a lower end thereof is embedded in the lower heating plate by 2 mm-3 mm; a diameter of the second inner heating element is $3/5$-$3/4$ of an outer diameter of the second outer sleeve.

11. A hot vacuum drying device applied for a flexible substrate, comprising a seal chamber, a lower heating plate fixed at a lower part of the seal chamber, an upper heating plate fixed at an upper part of the seal chamber, a lifter located under the seal chamber, a plurality of support pins fixed at the lifter and driven by the lifter to lift and a plurality of second support pins fixed on the lower heating plate;

the first support pin or the second support pin employed to support a substrate coated with organic material liquid to be positioned between the lower heating plate and the upper heating plate for baking; both the first support pin and the second support pin respectively using an insertion structure or a layer jacket structure to accelerate heat conduction to make a temperature difference between a contact part of the substrate with the first support pin or the second support pin and a non-contact part of the substrate with the first support pin or the second support pin decrease;

wherein the first support pin uses the layer jacket structure, and comprises a first outer sleeve which has a close upper end, and is hollow and cylindrical, a first inner heating element located in the first outer sleeve and a first wire electrically connected to the first inner heating element;

a wall of the first outer sleeve is formed with a through hole for passing the first wire; the first outer sleeve uses an insulation material, and the first inner heating element uses the same material of the lower heating plate; the other end of the first wire is electrically connected to a power source supplying electrical power for the lower heating plate;

wherein the second support pin uses the layer jacket structure, and comprises a second outer sleeve which has a close upper end, and is hollow and cylindrical, a second inner heating element located in the second outer sleeve and a second wire electrically connected to the second inner heating element;

the second outer sleeve uses an insulation material, and the second inner heating element uses the same material of the lower heating plate; the other end of the second wire is electrically connected to the lower heating plate;

wherein upper ends of the first outer sleeve and the second outer sleeve appear to be hemispherical, and upper ends of the first inner heating element and the second inner heating element appear to be hemispherical;

wherein an outer diameter of the first outer sleeve is 3 mm-10 mm; a diameter of the first inner heating element is $3/5$-$3/4$ of an outer diameter of the first outer sleeve;

wherein an outer diameter of the second outer sleeve is 2 mm-5 mm, and a lower end thereof is embedded in the lower heating plate by 2 mm-3 mm; a diameter of the second inner heating element is $3/5$-$3/4$ of an outer diameter of the second outer sleeve.

* * * * *